(12) United States Patent
Jackson

(10) Patent No.: US 6,342,471 B1
(45) Date of Patent: Jan. 29, 2002

(54) ELECTRICAL CONTACT CLEANER

(76) Inventor: Toney M. Jackson, 1300 Stethem Ferry, Alpharetta, GA (US) 30022

( * ) Notice: Subject to any disclaimer, the term of this patent is extended or adjusted under 35 U.S.C. 154(b) by 0 days.

(21) Appl. No.: 09/491,591

(22) Filed: Jan. 25, 2000

(51) Int. Cl.$^7$ .............................. C11D 7/30; C11D 7/50

(52) U.S. Cl. ................. 510/175; 510/245; 510/412; 252/364

(58) Field of Search .............................. 134/1, 2, 3, 34, 134/40, 11, 12, 38; 252/67, 364; 510/175, 176, 177, 408, 409, 410, 208, 412, 245

(56) References Cited

U.S. PATENT DOCUMENTS

| | | | |
|---|---|---|---|
| 3,554,918 A | * | 1/1971 | Schofiled et al. |
| 5,616,549 A | | 4/1997 | Clark |
| 5,824,162 A | | 10/1998 | Clark |
| 5,827,446 A | * | 10/1998 | Merchant et al. |
| 6,103,684 A | * | 8/2000 | Thenappan et al. |

FOREIGN PATENT DOCUMENTS

| WO | WO-96/00564 | * | 1/1996 |
|---|---|---|---|

OTHER PUBLICATIONS

Label of a product manufactured by Roly International of Ventura, California; and a Material Safety Data Sheet (MSDS) for this material dated Mar., 1997, (3 pgs.).

* cited by examiner

Primary Examiner—Yogendra N. Gupta
Assistant Examiner—Gregory E. Webb
(74) Attorney, Agent, or Firm—Mark W. Croll; Donald J. Breh

(57) ABSTRACT

A propellant-rich aerosol cleaner for use with electrical circuit boards and electrical connector components includes a solvent having a low or no ozone depletion potential and a propellant. The solvent is present in a concentration of at most about 50 percent by weight and preferably about 40 percent, and the propellant is present in a concentration of at least about 50 percent by weight and preferably about 60 percent, of the cleaner. The cleaner exhibits a cleaning characteristic of about 0.25 milligrams of soil per gram of cleaner delivered and exhibits low to no residual flammability. In one formulation, the solvent is n-propyl bromide and is present in a concentration of about 40 weight percent. In another formulation, the solvent is trichloroethylene and is present in a concentration of about 20 weight percent. An alternate formulation includes a solvent that is a blend of TCE or trans 1,2-dichloroethylene at a concentration of about 7 to 9 percent by weight and HFE at a concentration of about 21 percent by weight. A preferred propellant is tetrafluoroethane, an HFC liquefied gas, in a concentration of about 60 to 80 weight percent.

16 Claims, No Drawings

ELECTRICAL CONTACT CLEANER

FIELD OF THE INVENTION

The present invention pertains to a cleaner for electrical contacts. More specifically, the present invention pertains to a propellant-rich aerosol cleaner for use on electrical circuit boards, electrical contacts and the like.

BACKGROUND OF THE INVENTION

Electrical contact cleaners are used during the manufacture of electronic, telecommunications and other electrical equipment to clean the components prior to final assembly. These cleaners are also used during maintenance operations carried out on electrical equipment in order to provide for proper electrical conductivity where two conductive (e.g., metal) surfaces are to be joined to one another in electrical contact. These cleaners are used to remove grease and more particularly other contaminants such as light oils, oxidation products and the like.

Many such cleaners are provided in aerosol form. These aerosol cleaners include a solvent and a propellant. Typically, aerosol formulations are solvent-rich. That is, these cleaners include high concentrations of solvent relative to propellant. The solvent is that portion of the cleaner that dissolves or loosens the contaminants while the propellant is that portion of the cleaner that is used as a vehicle to communicate the solvent.

Early contact cleaners used a solvent of CFC-113 (Freon® TF, trichlorotrifluoroethane) as a solvent of choice. CFC-113 was an ideal candidate in that it had many advantageous characteristics, such as no flash point, no explosion limits, good solvency for hydrocarbon and fluorinated soils, and, it was believed, low toxicity. In addition, and importantly, it was found to be safe to use on plastics, such as those used for circuit board substrates. In addition, CFC-113 was found to evaporate quickly thus making it an ideal solvent. It was, however, found that CFCs, generally, and other halogenated substances could accelerate the destruction of stratospheric ozone.

As a result, numerous CFC-free contact cleaners were developed. One such cleaner was fluorodichloroethane (HCFC-141b) which became available in commercial quantities. While it was found that HCFC-141b had many of the advantageous properties of CFC cleaners, it was also found that HCFC-141b attacked certain plastics and also had an ozone depletion potential, albeit less than that of CFC-113. Other cleaners were subsequently developed including hydrofluoroethers (HFEs) and perfluorocarbons (PFCs) which, while having advantageous properties with respect to cleaning contamination from electrical circuit boards were found to be too expensive to be generally accepted in the marketplace.

With respect to these cleaners, there are a number of desirable physical and chemical properties and characteristics that these cleaners should exhibit. These include low flammability, high evaporation rate, excellent cleaning performance, good wetting, high dielectric breakdown and a reasonable level of plastic compatibility. In addition, these cleaners must be compatible with known aerosol delivery systems and must continue to provide these physical and chemical characteristics or properties and delivery system characteristics in a relatively low cost, low toxicity product that is commercially viable.

With respect to the propellants used in such cleaners, typically these cleaners use a pressurized gas, such as carbon dioxide ($CO_2$) as the propellant. $CO_2$ is non-flammable, relatively low in cost and provides adequate flow rates and atomization of the solvent. In a typical application, the carbon dioxide is used in a weight percent of about 3 percent to about 5 percent.

Another known propellant is a non-flammable HFC liquefied gas, such as tetrafluoroethane (HFC-134a). Generally, HFC-134a is used in solvent-rich cleaners and is found in weight percents of about 20 percent to about 30 percent by weight. HFC-134a is, however, a more expensive propellant than is $CO_2$.

One known propellant-rich cleaner includes a high-alcohol content solvent formulation. As such, it exhibits an unacceptably high residual flame characteristic that could render it unsafe for use in certain applications in which low residual flame properties are desirable.

Accordingly, there exists a need for an electrical contact cleaner that utilizes a solvent having good cleaning properties, as well as low toxicity, low or no ozone depletion potential and a degree of plastic compatibility. Desirably, such a cleaner uses a propellant that, in conjunction with the solvent, maintains low to no flammability and high evaporation rates and is acceptably priced for the marketplace. Most desirably, such a cleaner is propellant-rich and performs as well if not better than CFC based products.

SUMMARY OF THE INVENTION

A propellant-rich aerosol cleaner for use with electrical circuit boards and electrical connector components is formed from a solvent having a low or no ozone depletion potential and a propellant. The solvent is present in a concentration of at most about 50 percent by weight of the cleaner and the propellant is present in a concentration of at least about 50 percent by weight of the cleaner. Preferably, the solvent is present in a concentration of about 20 percent to about 40 percent by weight of the cleaner and the propellant is present in a concentration of about 60 percent to about 80 percent by weight of the cleaner. The cleaner exhibits cleaning characteristics of about 0.25 milligrams of soil per gram of solvent delivered and exhibits no residual flammability.

In a preferred formulation, the solvent is n-propyl bromide. The solvent can further include n-propanol. Preferably, the propellant is present in a concentration of about 60 percent by weight of the cleaner and the solvent is present in a concentration of about 40 percent by weight of the cleaner. In a current formulation, the n-propyl bromide is present in a concentration of about 37 percent by weight of the cleaner and the n-propanol is present in a concentration of about 1 percent to about 5 percent by weight of the cleaner.

In this formulation, the aerosol cleaner uses an HFC liquefied gas as a propellant. Preferably, the HFC liquefied gas is tetrafluoroethane and is present in a concentration of about 60 percent by weight of the cleaner.

In an alternate formulation, the aerosol cleaner includes trichloroethylene in a concentration of about 20 percent by weight of the cleaner as the solvent. In this formulation, the solvent can further include isopropyl alcohol in a concentration of about 2 percent to about 4 percent by weight of the cleaner. A preferred propellant is tetrafluoroethane in a concentration of about 77 percent by weight of the cleaner for this alternate formulation.

In still another alternate formulation, the aerosol cleaner uses either trichloroethylene or trans 1,2-dichloroethylene at a total concentration of about 7 percent to about 9 percent by weight in combination with a hydrofluoroether at about 21 percent by weight of the cleaner as the solvent. An acceptable hydrofluoroether is commercially available from 3M Company of St. Paul, Minn. under the tradename HFE 7100. In these formulations the solvent can further include isopropyl alcohol in a concentration of about 2 percent to about 4 percent by weight of the cleaner. A preferred propellant is tetrafluoroethane in a concentration of about 70 percent by weight of the cleaner for this alternate formulation.

Other features and advantages of the present invention will be apparent from the following detailed description, in conjunction with the appended claims.

DETAILED DESCRIPTION OF THE PREFERRED EMBODIMENTS

While the present invention is susceptible of embodiment in various forms, there will hereinafter be described presently preferred embodiments with the understanding that the present disclosure is to be considered an exemplification of the invention and is not intended to limit the invention to the specific embodiments illustrated.

An electrical contact cleaner in accordance with the present invention includes a propellant and a solvent. Preferably, the cleaner is a propellant-rich formulation. That is, the cleaner includes a relatively low solvent concentration and a relatively high propellant concentration. More preferably, the propellant concentration is greater than or equal to about 50 percent by weight of the cleaner and the solvent concentration is less than or equal to about 50 percent of the cleaner concentration on a weight basis. In a further preferred embodiment, the propellant is an HFC liquefied gas and the solvent is a brominated solvent. In a most preferred embodiment, the HFC liquefied gas is tetrafluoroethane (HFC-134a) and is present in a concentration of about 60 percent by weight and the brominated solvent is n-propyl bromide (nPB) and is present in a concentration of about 40 percent by weight. The nPB can further include a small amount of n-propanol, in which case, the nPB is about 37 percent to about 37½ percent by weight and the n-propanol is about 1 percent to about 3 to 5 percent by weight of the final cleaner formulation.

It has been found that brominated solvents, and most preferably nPB, have excellent characteristics for use as an electrical contact cleaner. Specifically, these brominated solvents have been found to have good solvency and little to no flammability. In addition, the solvents have been found to have low ozone depletion potentials (ODPs). As will be recognized by those skilled in the art, the lower the value of the ODP, the lower the adverse effect on the stratospheric ozone. To this end, it has been found that nPB has a low ODP, that is predicted to be about 0.002 to about 0.03 in a concentrated form. Most advantageously, the ODP of the cleaner is even lower when the nPB is in the final cleaner formulation.

In addition to the low ODP, it has been found that nPB has a relatively low atmospheric life. In fact, the atmospheric life of nPB is about 16 days. As such, it is believed that the use of nPB will have little to no adverse effect on stratospheric ozone.

Moreover, nPB has been observed to have good solvency characteristics and minimal to no flammability. With respect to flammability, it has been observed that nPB and in particular the present cleaner formulation, exhibits little to no residual flammability when subject to a test similar to the Cleveland Open Cup Flash Point method. In this test, which will be recognized by those skilled in the art, an open flame is passed in proximity to an open pool or puddle of the material until evaporation. It was found that there was no ignition of the cleaner formulation.

A preferred propellant for use in the cleaner is an HFC liquefied gas. Most preferably, the propellant is a tetrafluoroethane (HFC-134a) and is present in a concentration of equal to or greater than 50 percent by weight of the cleaner. Most preferably, the propellant is present in a concentration of 60 percent or greater by weight of the cleaner.

Unexpectedly, it is has been found the present propellant-rich cleaning formulation provides nearly all of the desirable characteristics for such an electrical contact cleaner. That is, the cleaner does not exhibit flame extension when tested by the Flame Projection Test as set forth in Aerosol Guide, issued by Chemical Specialties Manufacturing Association (CSMA, Washington, D.C.), *Revised Flammability Tests Methods For Aerosol Products*, pages 11-12, 5th Ed., 1966. The Flame Projection Test provides a flame projection, also called a flame extension value, where lower values are preferred and a value of zero is most preferred. This is considered non-flammable for purposes of labeling and shipping. Nor, as discussed above, does the preferred cleaner exhibit significant residual flammability. Thus, unlike known propellant-rich cleaner formulations, the preferred cleaner reduces and/or eliminates the risk associated with spraying the cleaner around energized electrical equipment and further reduces or eliminates the risk of re-energizing equipment prior to complete evaporation of the cleaner.

A cleaner in accordance with the present invention also evaporates quickly after it is sprayed onto equipment. It has been found that the cleaner evaporates at least as fast as the earlier known CFC-113 aerosol cleaners. Even though the present cleaner evaporates quickly, it nevertheless exhibits insignificant icing. That is, there is little to no freezing of moisture out of the air onto the surface of the electrical components immediately following application of the cleaner. This phenomena is typically exhibited with cleaners that rapidly evaporate. As will be understood by those skilled in the art, this icing effect is an undesirable characteristic of cleaners. To this end, although a considerable number of presently available commercial cleaners do, in fact, exhibit this effect to a relatively great extent, the preferred cleaner formulation does not.

With respect to cleaning of the electrical contact surfaces, in a typical application, these cleaners encounter lighter soils than do industrial degreasers. Typically these soils include dust, fingerprint oils and other light oils as opposed to adhesives, resins and the like. A most preferred cleaner should equal or better the cleaning performance of CFC-113 and should exhibit a cleaning characteristic of at least about 0.25 milligrams of soil per gram of cleaning product delivered.

In determining this cleaning characteristic, a group of rust-free 3 inch by 5 inch steel Q-panel samples were selected and prepared by first thoroughly cleaning the panels. Each of the group of panels was held using clean metal forceps to prevent later contamination and to assure complete preparation. The panels were cleaned by spraying each panel with LPS ZeroTri cleaner on their respective fronts and backs. This cleaner is available from LPS Laboratories of Tucker, Ga.

The cleaned panels were placed on top of clean beakers in an oven at 105° C. and allowed to dry thoroughly. The panels were removed from the oven and were placed upright on a clean surface to allow them to cool to room temperature.

The panels were then segregated for identification and were weighed on an analytical balance (capable of weighing to 0.1 mg) that was pre-tared with an appropriate support so that the panels did not rest on the pan of the balance. The weight of each of the cleaned panels was recorded.

The cleaned panels were next sprayed on one side (a shiny side) with a film producing agent (LPS 1 Greaseless Lubricant commercially available from LPS Laboratories of Tucker, Ga.) to emulate soil or contamination. The excess agent was allowed to run off of the panel. The coated panels were placed, film side up, on top of beakers in the oven at 105° C. for two hours to dry.

The panels were then removed and placed upright on a clean surface to allow the panels to cool to room temperature. The panels were then each weighed on the analytical balance and the weights recorded. The weight of each panel was subtracted from the combined weight of the panel plus dried film to determine the weight of the dried film (i.e., soil simulation agent) deposited.

A number of sample contact cleaner aerosol cans were then selected and the flow rate for a five second period for each aerosol can was determined. Each aerosol can was then weighed on a standard balance capable of weighing to 0.01 gm. and the weight was recorded.

The panels were each held upright and sprayed, from a distance of about six inches, on the entire film coated side of the panel with the contact cleaner for five seconds to apply approximately the same amount of contact cleaner to each panel. The cleaned panels were then placed on top of the beakers in the oven at 105° C. to allow the panels to dry thoroughly.

Each of the cans of contact cleaner was then reweighed and the weight recorded. The after use weight was subtracted from the original full weight to determine the amount of contact cleaner that was sprayed from each can.

The now cleaned panels were then removed from the oven and were allowed to cool to room temperature.

Each panel was then weighed and the weight recorded. The cleaned weight was subtracted from the combined weight of the panel plus dried film to determine the weight of soil simulation agent that was removed in the cleaning process.

The solvency power of the contact cleaner was determined by dividing the weight (in grams) of the soil simulation agent that was removed by cleaning by the weight of contact cleaner that was sprayed onto the surface of the panel. These values were multiplied by 1000 to obtain the value in milligrams of film (soil simulation agent) removed per gram of contact cleaner used.

The present cleaner also exhibits a degree of plastic compatibility. As will be recognized by those skilled in the art, numerous plastics are used for a substrate or support in printed circuit boards. One popular substrate material is polycarbonate. The known solvent-rich cleaners typically attack these plastic materials. To this end, while these known cleaners may, in fact be acceptable for use on the metal, electrically conducting surfaces, they can have a devastating impact on the plastic circuit board substrate. While the preferred cleaner in accordance with the present invention exhibits some attack of polycarbonate and other plastics used for circuit board manufacture, an alternate form of the preferred cleaner does not cause rapid cracking of the polycarbonate substrate material as is exhibited by known solvent-rich aerosol cleaners. Rather, the degradation is limited to slight crazing of a stressed, thin sheet of the polycarbonate material.

Another drawback to known propellant-rich cleaners is that their respective wetting characteristics are unacceptable. That is, these propellant-rich cleaners have not been shown to adequately wet the substrates. Wetting has been observed to enhance dissolving contaminants which, in turn, facilitates removal of these contaminants. This would then suggest that a propellant-rich cleaner would in fact exhibit lesser cleaning characteristics than known solvent-rich cleaners. However, unexpectedly, the propellant-rich cleaner in accordance with the present invention provides good wetting characteristics so that the circuit board and electrical contact surfaces are acceptably wetted when the cleaner is applied.

In addition, the preferred contact cleaner has a relatively high dielectric breakdown voltage. Early contact cleaners, e.g., CFC-based cleaners, exhibited high dielectric breakdown voltages, on the order of about 30 KV. However, as presented above, these early contact cleaners were found to be detrimental to stratospheric ozone, i.e., high ODP values. Subsequent contact cleaners that exhibited more acceptable ODP values, however, exhibited lower breakdown voltages, in the range of about 8–20 KV. The preferred contact cleaner has a dielectric breakdown voltage in a range of at least about 20–30 KV, while maintaining an acceptably low ODP.

The present contact cleaner also exhibits advantageous properties with respect to aerosol delivery systems. The cleaner functions well in a variety of packaging or application systems. In particular, the cleaner functions well in packaging or systems in which the container is inverted for application, that is, the container it is turned upside down for spraying and use. Other considerations for which the present contact cleaner shows advantageous properties include low toxicity and ready availability of raw materials.

Other formulations of the present propellant-rich cleaner are also contemplated to be within the scope of the present invention. One such alternate formulation includes a solvent blend of trichloroethylene (TCE) and isopropyl alcohol. In this alternate formulation, the TCE is present is a concentration of about 20 percent by weight and the isopropyl alcohol is present in a concentration of about 2 to about 4 percent by weight. The remaining 76 to 78 weight percent is again propellant, preferably tetrafluoroethane (HFC-134a). This alternate cleaner formulation has physical and chemical properties similar to that of the nPB solvent-based formulation and, depending on the solvent blend composition, a degree of plastic compatibility, low or no ODP and no or low flammability characteristics.

In still further alternate formulations, the aerosol cleaner can use either trichloroethylene or trans 1,2-dichloroethylene at a total concentration of about 7 percent to about 9 percent by weight in combination with the above-noted hydrofluoroether, commercially available from 3M Company under the tradename HFE 7100, in a concentration of about 21 percent by weight of the cleaner as solvent. In these formulations, the solvent can further include isopropyl alcohol in a concentration of about 2 percent to about 4 percent by weight of the cleaner. The remaining 66 to 70 percent by weight of the cleaner for these alternate formulations is preferably tetrafluoroethane. These alternate cleaner formulations have physical and chemical properties similar to that of the nPB solvent-based formulation, and depending on the solvent blend composition, a degree of plastic compatibility, low or no ODP and no or low flammability characteristics.

From the foregoing it will be observed that numerous modifications and variations can be effectuated without departing from the true spirit and scope of the novel concepts of the present invention. It is to be understood that no limitation with respect to the specific embodiments illustrated is intended or should be inferred. The disclosure is intended to cover by the appended claims all such modifications as fall within the scope of the claims.

What is claimed is:

1. A propellant-rich aerosol cleaner for use with electrical circuit boards and electrical connector components, comprising:
   a solvent having a low ozone depletion potential; and
   a propellant, the propellant being tetrafluoroethane,
   wherein the solvent is present in a concentration of at most 50 percent by weight of the cleaner and the propellant is present in a concentration of at least 50 percent by weight of the cleaner, and wherein the cleaner exhibits a cleaning characteristic of about 0.25 milligrams of soil per gram of cleaner delivered and wherein the cleaner further exhibits low to no residual flammability.

2. The propellant-rich aerosol cleaner in accordance with claim 1 wherein the solvent is n-propyl bromide.

3. The propellant-rich aerosol cleaner in accordance with claim 2 wherein the solvent further includes n-propanol.

4. The propellant-rich aerosol cleaner in accordance with claim 1 wherein the propellant is present in a concentration of about 60 percent by weight of the cleaner and the solvent is present in a concentration of about 40 percent by weight of the cleaner.

5. The propellant-rich aerosol cleaner in accordance with claim 3 wherein the solvent is n-propyl bromide in a concentration of about 37 percent by weight of the cleaner and n-propanol in a concentration of about 1 percent to about 5 percent by weight of the cleaner.

6. The propellant-rich aerosol cleaner in accordance with claim 1 wherein the tetrafluoroethane is present in a concentration of about 60 percent by weight of the cleaner.

7. The propellant-rich aerosol cleaner in accordance with claim 1 wherein the solvent is trichloroethylene and is present in a concentration of about 20 percent by weight of the cleaner.

8. The propellant-rich aerosol cleaner in accordance with claim 7 wherein the solvent further includes isopropyl alcohol in a concentration of about 2 percent to about 4 percent by weight of the cleaner.

9. The propellant-rich aerosol cleaner in accordance with claim 8 wherein the propellant is tetrafluoroethane in a concentration of about 77 percent by weight of the cleaner.

10. The propellant-rich aerosol cleaner in accordance with claim 1 wherein the solvent is a hydrofluoroether and one of trans 1,2-dichloroethylene and trichloroethylene.

11. The propellant-rich aerosol cleaner in accordance with claim 10 wherein the hydrofluoroether is present in a concentration of about 21 percent by weight of the cleaner and the one of trans 1,2-dichloroethylene and trichloroethylene is present in a concentration of about 7 percent to about 9 percent by weight of the cleaner.

12. The propellant-rich aerosol cleaner in accordance with claim 11 wherein the solvent further includes isopropyl alcohol in a concentration of about 2percent to about 4 percent by weight of the cleaner.

13. The propellant-rich aerosol cleaner in accordance with claim 12 wherein the propellant is tetrafluoroethane in a concentration of about 66 percent to about 70 percent by weight of the cleaner.

14. A propellant-rich aerosol cleaner for use with electrical circuit boards and electrical connector components, comprising:
   a solvent having a low ozone depletion potential, the solvent being n-propyl bromide; and
   a propellant comprising tetrafluoroethane,
   wherein the n-propyl bromide is present in a concentration of at most 50 percent by weight of the cleaner, and the tetrafluoroethane is present in a concentration of at least 50 percent by weight of the cleaner, and wherein the cleaner exhibits a cleaning characteristic of about 0.25 milligrams of soil per gram weight of cleaner delivered and wherein the cleaner exhibits low to no residual flammability.

15. The propellant-rich aerosol cleaner in accordance with claim 14 wherein the solvent is present in a concentration of about 40 percent by weight of the cleaner and the propellant is present in a concentration of about 60 percent by weight of the cleaner.

16. The propellant-rich aerosol cleaner in accordance with claim 14 wherein the solvent further include n-propanol in a concentration of about 1 percent to about 5 percent by weight of the cleaner.

* * * * *